United States Patent
Cheng et al.

(10) Patent No.: US 10,573,950 B2
(45) Date of Patent: Feb. 25, 2020

(54) DIRECTIONAL COUPLER

(71) Applicant: QUALCOMM Incorporated, San Diego, CA (US)

(72) Inventors: Haitao Cheng, San Diego, CA (US); Zhang Jin, San Diego, CA (US); Abbas Abbaspour-Tamijani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/947,293

(22) Filed: Apr. 6, 2018

(65) Prior Publication Data

US 2018/0294540 A1    Oct. 11, 2018

Related U.S. Application Data

(60) Provisional application No. 62/484,165, filed on Apr. 11, 2017.

(51) Int. Cl.
*H01P 5/18* (2006.01)
*H03H 7/48* (2006.01)
(Continued)

(52) U.S. Cl.
CPC ............. *H01P 5/18* (2013.01); *H03F 1/565* (2013.01); *H03F 3/195* (2013.01); *H03F 3/20* (2013.01);
(Continued)

(58) Field of Classification Search
CPC ... H01P 5/18; H01P 5/187; H03F 1/56; H03F 3/24
(Continued)

(56) References Cited

U.S. PATENT DOCUMENTS 3,641,451 A * 2/1972 Hollingsworth .......... H03F 1/52
                                                                 330/134
4,122,400 A * 10/1978 Medendorp ............... H03F 1/52
                                                               330/207 P
(Continued)

FOREIGN PATENT DOCUMENTS

WO    2015184076 A1    12/2015
WO    2017044729 A1    3/2017

OTHER PUBLICATIONS

International Search Report and Written Opinion—PCT/US2018/026630—ISA/EPO—dated Jul. 4, 2018.

*Primary Examiner* — Dean O Takaoka
(74) *Attorney, Agent, or Firm* — Patterson & Sheridan, LLP

(57) ABSTRACT

Certain aspects of the present disclosure provide a directional coupler. In certain aspects, the directional coupler generally includes a first inductor and a second inductor wirelessly coupled to the first inductor. In certain aspects, the directional coupler generally includes an input port at a first terminal of the first inductor and a transmitted port at a second terminal of the first inductor. In certain aspects, the directional coupler generally includes a coupled port at a first terminal of the second inductor and an isolated port at a second terminal of the second inductor. In certain aspects, the directional coupler generally includes a first complex impedance component directly coupled to the isolated port and a second complex impedance component directly coupled to the coupled port.

26 Claims, 10 Drawing Sheets

(51) Int. Cl.

| | | |
|---|---|---|
| *H04L 25/02* | (2006.01) | |
| *H03F 1/56* | (2006.01) | |
| *H03F 3/20* | (2006.01) | |
| *H03H 7/01* | (2006.01) | |
| *H04W 88/06* | (2009.01) | |
| *H04B 1/04* | (2006.01) | |
| *H04B 1/18* | (2006.01) | |
| *H03H 7/46* | (2006.01) | |
| *H03F 3/60* | (2006.01) | |
| *H03F 3/195* | (2006.01) | |
| *H03F 3/24* | (2006.01) | |

(52) U.S. Cl.
CPC ............ *H03F 3/245* (2013.01); *H03F 3/60* (2013.01); *H03H 7/0115* (2013.01); *H03H 7/0138* (2013.01); *H03H 7/1741* (2013.01); *H03H 7/468* (2013.01); *H03H 7/487* (2013.01); *H04B 1/04* (2013.01); *H04B 1/0458* (2013.01); *H04B 1/18* (2013.01); *H04L 25/0264* (2013.01); *H04W 88/06* (2013.01); *H01P 5/187* (2013.01); *H03F 2200/207* (2013.01); *H03F 2200/465* (2013.01); *H03F 2200/541* (2013.01); *H04B 2001/0408* (2013.01)

(58) Field of Classification Search
USPC .......................................... 333/109, 112, 116
See application file for complete search history.

(56) References Cited

U.S. PATENT DOCUMENTS

| | | | | |
|---|---|---|---|---|
| 4,701,724 A * | 10/1987 | Martin | ...................... | H04B 1/48 333/103 |
| 5,038,112 A * | 8/1991 | O'Neill | ................ | H03G 3/3047 330/207 P |
| 6,972,640 B2 * | 12/2005 | Nagamori | ............... | H01P 5/185 333/116 |
| 7,160,823 B2 * | 1/2007 | Park | ...................... | C03C 14/004 257/E23.009 |
| 7,336,143 B2 * | 2/2008 | Katsumata | ................ | H01P 1/18 333/139 |
| 7,821,352 B1 * | 10/2010 | Sanvoravong | .......... | H01P 5/185 333/116 |
| 8,095,085 B2 * | 1/2012 | Song | ........................ | H03J 3/06 455/107 |
| 8,175,554 B2 * | 5/2012 | Camuffo | .............. | H03G 3/3042 455/126 |
| 9,197,255 B2 * | 11/2015 | Pourkhaatoun | ...... | H04B 1/0458 |
| 2002/0113601 A1 * | 8/2002 | Swank, II | .............. | G01R 27/06 324/637 |
| 2010/0019983 A1 * | 1/2010 | Bonnet | ..................... | H01P 5/18 343/861 |
| 2011/0254637 A1 | 10/2011 | Manssen et al. | | |
| 2014/0004810 A1 | 1/2014 | Cohen et al. | | |
| 2014/0313088 A1 * | 10/2014 | Rozenblit | ................ | H03H 7/40 343/745 |
| 2015/0072632 A1 * | 3/2015 | Pourkhaatoun | ...... | H04B 1/0458 455/127.2 |
| 2015/0084718 A1 | 3/2015 | Maxim et al. | | |
| 2015/0091668 A1 * | 4/2015 | Solomko | .................. | H01P 5/18 333/109 |
| 2015/0349742 A1 | 12/2015 | Chen et al. | | |
| 2016/0065167 A1 * | 3/2016 | Granger-Jones | ........ | H01F 38/14 333/112 |
| 2016/0079649 A1 | 3/2016 | Ilkov et al. | | |
| 2016/0079650 A1 * | 3/2016 | Solomko | .................. | H03H 7/48 333/103 |
| 2016/0172738 A1 | 6/2016 | Srirattana et al. | | |
| 2017/0026020 A1 | 1/2017 | Solomko et al. | | |
| 2017/0279469 A1 | 9/2017 | Ma et al. | | |
| 2017/0324392 A1 * | 11/2017 | Srirattana | ............... | H01P 5/188 |
| 2018/0048046 A1 * | 2/2018 | Noguchi | ................... | H01P 1/24 |

* cited by examiner

DIRECTIONAL COUPLER

CROSS-REFERENCE TO RELATED APPLICATIONS

This application claims the benefit of U.S. Provisional Patent No. 62/484,165, filed Apr. 11, 2017. The content of the provisional application is hereby incorporated by reference in its entirety.

TECHNICAL FIELD

Certain aspects of the present disclosure generally relate to electronic circuits and, more particularly, to a directional coupler.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, new radio (NR), or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, Long Term Evolution Advanced (LTE-A), and NR networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

A wireless device such as a BS or MS may include a transmitter and a receiver coupled to an antenna to support two-way communication. For data transmission, the transmitter may modulate a radio frequency (RF) carrier signal with data to obtain a modulated RF signal, amplify the modulated RF signal to obtain an output RF signal having the proper output power level, and transmit the output RF signal via the antenna to a receiving device. The transmitter may further include a directional coupler. For data reception, the receiver may obtain a received RF signal via the antenna and may condition and process the received RF signal to recover data sent by the transmitting device.

A wireless device may include one or more transmitters and one or more receivers coupled to one or more antennas. It is desirable to implement the transmitters and receivers to achieve good performance while reducing circuitry and cost.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include an improved directional coupler.

Certain aspects of the present disclosure provide a directional coupler. The directional coupler generally includes a first inductor and a second inductor wirelessly coupled to the first inductor. The directional coupler generally includes an input port at a first terminal of the first inductor and a transmitted port at a second terminal of the first inductor. The directional coupler generally includes a coupled port at a first terminal of the second inductor and an isolated port at a second terminal of the second inductor. The directional coupler generally includes a first complex impedance component directly coupled to the isolated port and a second complex impedance component directly coupled to the coupled port.

Certain aspects of the present disclosure provide a wireless communication apparatus. The wireless communication apparatus generally includes a power amplifier. The wireless communication apparatus generally includes an antenna. The wireless communication apparatus generally includes a directional coupler coupled between the power amplifier and the antenna, wherein the directional coupler comprises an input port, a transmitted port, a coupled port, and an isolated port. The wireless communication apparatus generally includes a first complex impedance component coupled to the isolated port and a second complex impedance component coupled to the coupled port. The wireless communication apparatus further includes a first power detector coupled to the isolated port and configured to measure a first power at the isolated port. The wireless communication apparatus further includes a second power detector coupled to the coupled port and configured to measure a second power at the coupled port.

Certain aspects of the present disclosure provide a method of operating a directional coupler comprising an input port, a transmitted port, a coupled port, and an isolated port, wherein a first complex impedance component is coupled to the isolated port and a second complex impedance component is coupled to the coupled port. The method includes measuring a first power at the isolated port and a second power at the coupled port at substantially the same time. The method further includes calculating an antenna return loss based on the measured first power and the measured second power.

Aspects generally include methods, apparatus, systems, computer readable mediums, and processing systems, as substantially described herein with reference to and as illustrated by the accompanying drawings.

To the accomplishment of the foregoing and related ends, the one or more aspects comprise the features hereinafter fully described and particularly pointed out in the claims.

The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

Figure 1:
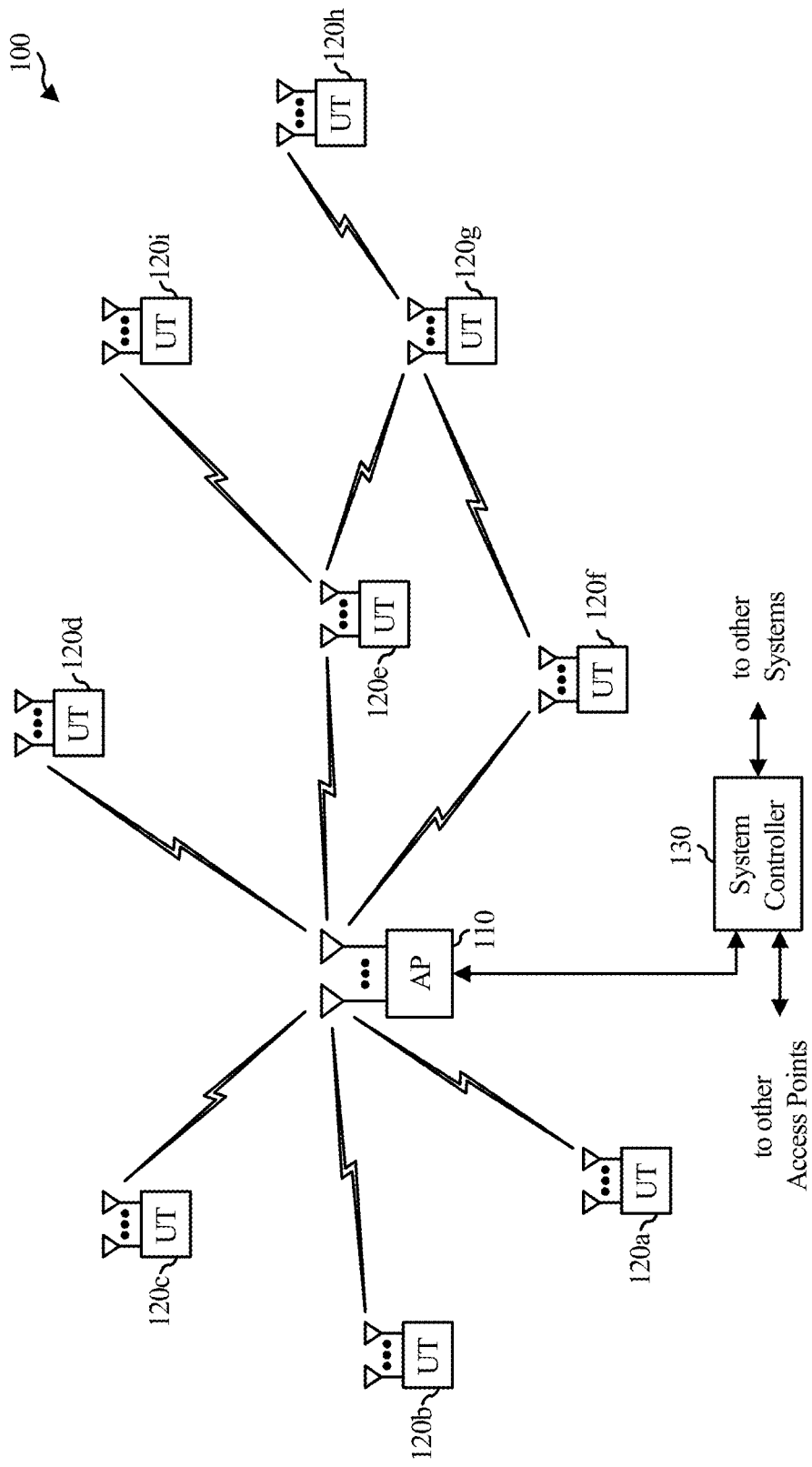
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), gNB, or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more amplifiers coupled to one or more antennas to amplify and transmit signals. In certain aspects, a directional coupler in accordance with certain aspects of the present disclosure may be coupled between at least one of the amplifiers and at least one of the antennas.

Figure 2:
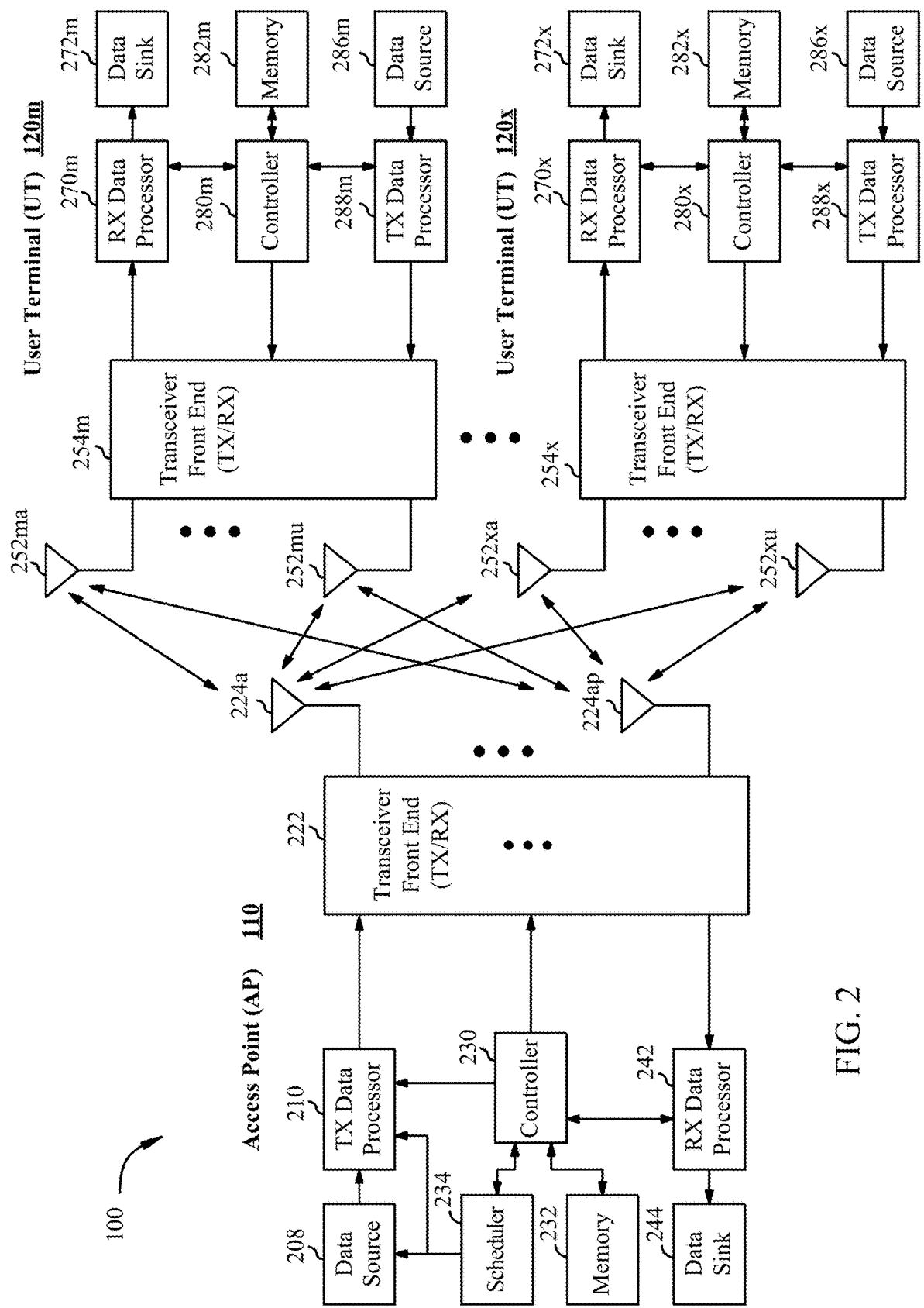
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more amplifiers coupled to one or more antennas to amplify and transmit signals. In certain aspects, a directional coupler in accordance with certain aspects of the present disclosure may be coupled between at least one of the amplifiers and at least one of the antennas.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
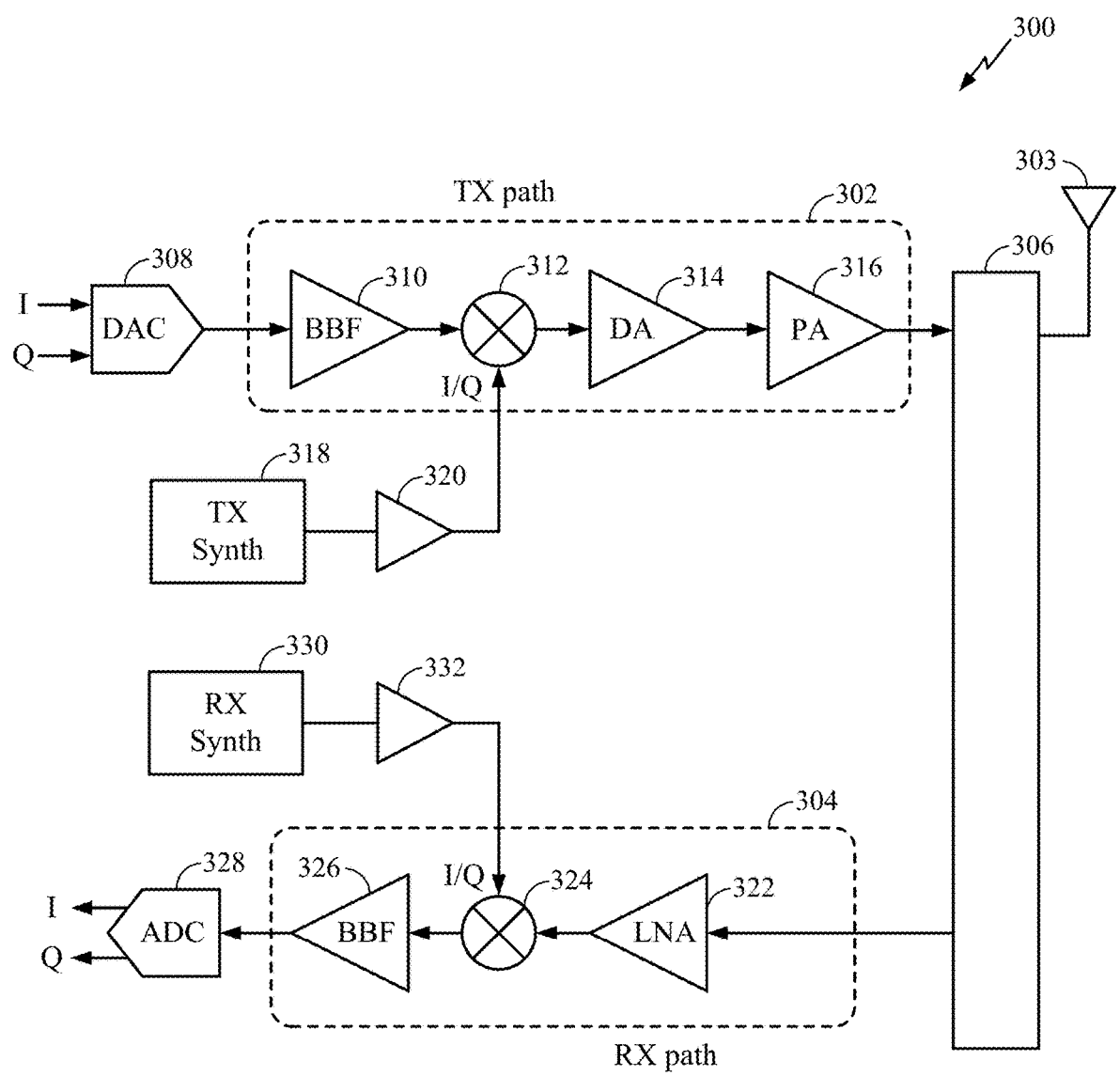
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC). In certain aspects, the PA 316 may be internal to the RFIC. In certain aspects, the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Figure 4:
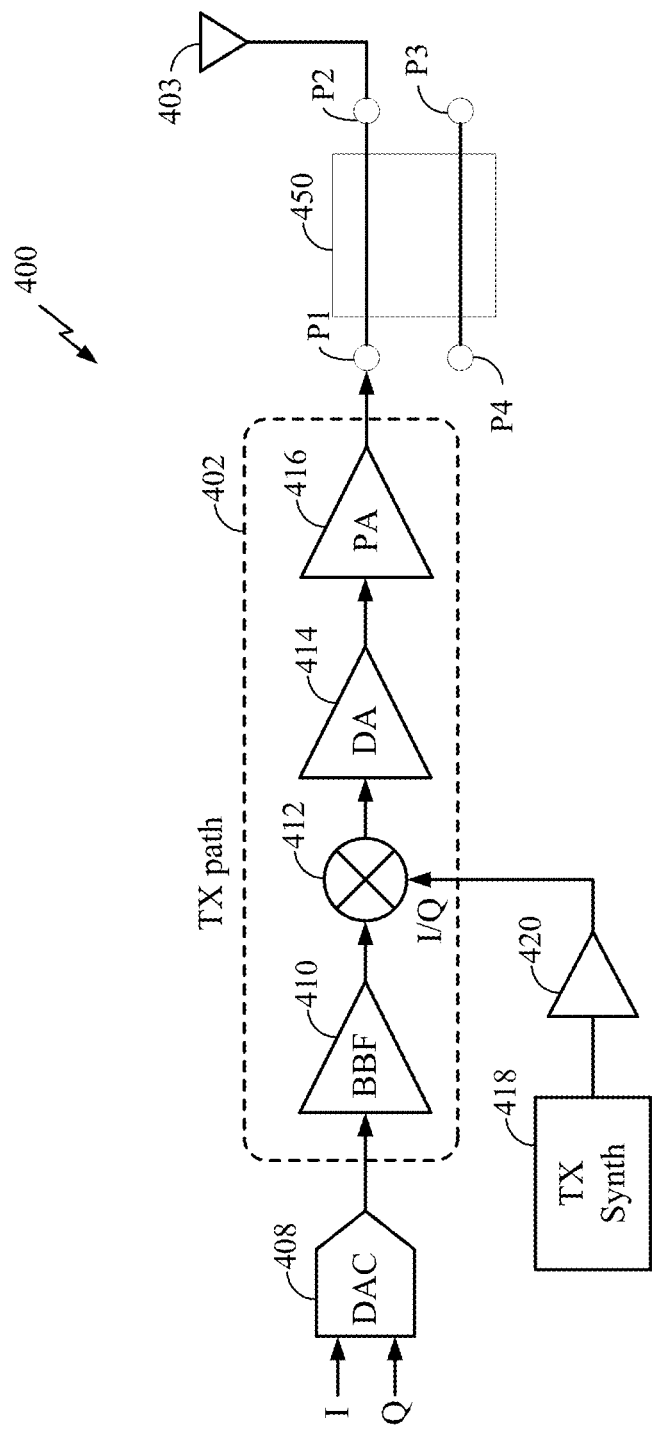
FIG. 4 is a block diagram of an example TX circuitry including a directional coupler, in accordance with certain aspects of the present disclosure.

FIG. 4 is a block diagram of an example TX circuitry 400 including a TX path 402 similar to TX path 302 of FIG. 3. For example, TX path 402 includes a BBF 426, mixer 412, DA 414, and PA 416, similar to BBF 326, mixer 312, DA 314, and PA 316 of FIG. 3, respectively. As shown, TX circuitry 400 further includes a DAC 408, TX frequency synthesizer 418, and amplifier 420, similar to DAC 308, TX frequency synthesizer 318, and amplifier 320 of FIG. 3, respectively. TX circuitry 400 further includes a directional coupler 450. In particular, the directional coupler 450, as shown, includes four ports: an input port P1, a transmitted port P2, a coupled port P3, and an isolated port P4. In certain aspects, directional coupler 450 includes a first coupling (e.g., transmission line) between input port P1 and transmitted port P2, and a second coupling (e.g., transmission line) between coupled port P3 and isolated port P4. As shown, the directional coupler 450 is coupled in-between the PA 416 and the antenna 403 (e.g., similar to antenna 303 of FIG. 3). In particular, in certain aspects, the output of the PA 416 is coupled to input port P1, and the antenna 403 is coupled to transmitted port P2. In certain aspects, the directional coupler 450 couples an amount of the electromagnetic power in the first coupling to the coupled port P3. In certain aspects, the directional coupler 450 couples power flowing in one direction, from the input port P1 to the transmitted port P2 at coupled port P3. Power flowing in the other direction (e.g., reflected power from the antenna 403), from transmitted port P2 to input port P1, is instead coupled at isolated port P4. Accordingly, in certain aspects, the signal at coupled port P3 is indicative of/can be used to measure the amount of power output by the PA 416 and does not include the power entering transmitted port P2 on the coupling between input port P1 and transmitted port P2. In particular, the signal at coupled port P3 is indicative of/can be used to measure the power entering input port P1 and flowing from the input port P1 to the transmitted port P2.

Further, in certain aspects, the signal at isolated port P4 is indicative of/can be used to measure the amount of power reflected from antenna 403 and does not include the power entering input port P1 (e.g., output by PA 416) on the coupling between input port P1 and transmitted port P2. In particular, the signal at isolated port P4 is indicative of/can be used to measure the power entering transmitted port P2 and flowing from the transmitted port P2 to the input port P1.

Though certain aspects of a directional coupler are described herein implemented in a TX path of a wireless device, it should be noted that the described aspects are not limited to such an implementation. In particular, aspects of a directional coupler described herein may be used in any suitable implementation.

A directional coupler may be defined by certain properties including the coupling factor, loss, isolation, and directivity of the directional coupler. The coupling factor $$C = 10\log\left(\frac{P_3}{P_1}\right)$$

decibels (dB), where $P_3$ is the output power at coupled port P3, and $P_1$ is the input power at input port P1. The directivity $$D = -10\log\left(\frac{P_4}{P_3}\right)$$

decibels (dB), where $P_3$ is the output power at coupled port P3, and $P_4$ is the output power at isolated port P4. In certain aspects, it is desirable to have the directivity D be as high as possible. Accordingly, certain aspects described herein relate to a directional coupler with a high directivity.

In certain aspects, a directional coupler (e.g., directional coupler 450) may include a first transmission line between input port P1 and the transmitted port P2 and a second transmission line between isolated port P4 and coupled port P3. The first and second transmission lines may be set close enough together such that energy passing through the first transmission line is coupled to the second transmission line. Further, in certain aspects, the isolated port P4 may be terminated with (e.g., coupled to) a matched load (e.g., having an impedance of 50 ohms (e.g., a resistor)). In certain aspects, such a directional coupler design may be implemented on-chip (e.g., in an RFIC). In such an implementation, due to the intrinsic properties of the on-chip system, the propagation constants for even mode and odd mode for the on-chip transmission lines may be different. In particular, an on-chip system may be implemented with heterogeneous materials due to the substrate used to implement the on-chip system. For example, the on-chip system may be implemented using different dielectrics (e.g., $SiO_2$ and Si). Use of such heterogeneous materials may lead to the propagation constants for even mode and odd mode for the on-chip transmission lines to be different. Due to the nature of the different propagation constants of the even and odd modes, the directivity of such a directional coupler may be limited.

In some aspects, an inductor is coupled between input port P1 and transmitted port P2; another inductor is coupled between coupled port P3 and isolated port P4; a capacitor is coupled between input port P1 and coupled port P3; and another capacitor is coupled between output port P2 and isolated port P4. However, in certain aspects, in such implementations, the inductor and capacitor may need to use specific inductance and capacitance values in such a configuration to achieve a higher directivity, which may reduce design flexibility. Further, capacitance variance due to process corners decreases coupler directivity.

In some aspects, a directional coupler may be implemented using a homogenous material, such as on a printed circuit board (PCB) where the materials used to form transmission lines are homogenous. Such a directional coupler implemented using a homogenous material, such as on a PCB, may have improved directivity as compared to a directional coupler implemented using heterogeneous materials, such as in an on-chip system. However, such a PCB implementation of a directional coupler may make require pads (e.g., 3-4 pads) be placed on the PCB including the directional coupler by using differential transmission lines. This may make the device larger, which is undesirable. For example, a pad may need to be placed on a PCB, such as at the location of each of P1-P4, since the directional coupler would be a 4-port device and needs to connect to the PCB at each of P1-P4.

Figure 5:
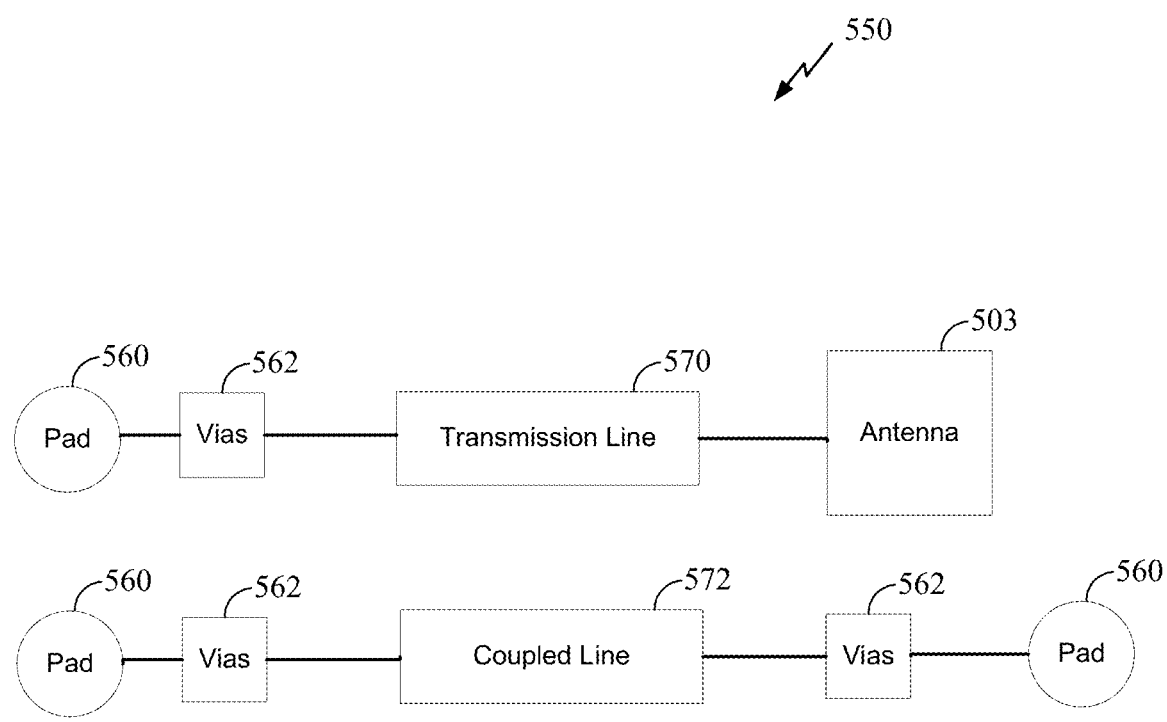
FIG. 5 illustrates an example of a directional coupler, in accordance with aspects of the present disclosure.

FIG. 5 illustrates an example of such an on PCB directional coupler 550, in accordance with aspects of the present disclosure. As shown, pads 560, vias 562, antenna 503 (e.g., similar to antenna 403 of FIG. 4), transmission line 570, and coupled line 572 may all be components on a PCB or package forming the directional coupler 550. As shown, there are three pads 560. One pad is to connect the PA 416 (FIG. 4) to the transmission line, and two pads 560 are additionally needed to connect to the coupled port P3 and isolated port P4.

Accordingly, certain aspects herein provide a directional coupler design with a high directivity that can also be implemented using heterogeneous materials, such as in an on-chip implementation. In certain aspects, the directional coupler includes a first inductor coupled between input port P1 and transmitted port P2 and a second inductor coupled between coupled port P3 and isolated port P4. Accordingly, in certain aspects, the directional coupler includes a transformer. In certain aspects, the directional coupler does not include a physical capacitor coupled between input port P1 and coupled port P3 (though in certain aspects a parasitic capacitance is present between input port P1 and coupled port P3) and does not include a physical capacitor coupled between transmitted port P2 and isolated port P4 (though in certain aspects a parasitic capacitance is present between transmitted port P2 and isolated port P4).

In certain aspects, the isolated port P4 of the directional coupler may be terminated with (e.g., coupled to) a complex impedance (e.g., a component providing the real part of the impedance (e.g., a resistor) and a component providing the imaginary part of the impedance (e.g., a capacitor, an inductor, a capacitor and an inductor, etc.). Further, in addition to the isolated port P4 being terminated with a complex impedance, in certain aspects, the coupled port P3 of the directional coupler may be terminated with (e.g., coupled to) a complex impedance (e.g., a component providing the real part of the impedance (e.g., a resistor) and a component providing the imaginary part of the impedance (e.g., a capacitor, an inductor, a capacitor and an inductor, etc.). In certain aspects, the real part of the complex impedance may be used to adjust amplitude of a transmitted signal, and the imaginary part of the complex impedance may be used to adjust phase of the transmitted signal. The complex impedances may be variable.

In certain aspects, the directional coupler including a transformer and a complex impedance coupled to the isolated port and coupled port of the directional coupler may have a high directivity (e.g., several hundreds of times that of a transmission line directional coupler with a 50 ohm matched load at the isolated port), even when implemented using heterogeneous materials. In particular, by coupling a complex impedance to both the coupled port P3 and isolated port P4 at the same time, a high directivity of power can be measured both for the power flow from transmitted port P2 to the input port P1 and for the power flow in the opposite direction from input port P1 to transmitted port P2. In certain aspects, the complex impedances are directly coupled (e.g., there is no switch coupled between) to the coupled port P3 and isolated port P4, respectively, at the same time, which allows power flow from transmitted port P2 to the input port P1 and for the power flow in the opposite direction from input port P1 to transmitted port P2 to be measured at the same time. Indirect coupling, such as via a switch, may introduce parasitic capacitance in the circuit, which may degrade directivity. In certain aspects, the complex impedances being directly coupled to the coupled port P3 and isolated port P4, respectively, can mean that there may be other components (but not switches) coupled between the complex impedances and the coupled port P3 and isolated port P4, respectively, however the coupled port P3 and isolated port P4 are both coupled to respective complex impedances at the same time. However, in certain aspects, indirect coupling such as via a switch, may be used, where the switch(es) is controlled to simultaneously couple the complex impedances to the coupled port P3 and isolated port P4, respectively, at the same time.

Further, in certain aspects, such a directional coupler may be implemented on-chip (e.g., RFIC) (e.g., as one turn or multi-turn) and still maintain high directivity, unlike other directional coupler designs. In particular, the transmission lines forming the directional coupler may be implemented on-chip. Alternatively, such a directional coupler may instead be implemented on printed circuit board (PCB) applications. For example, the directional coupler may need only one pad on a PCB to couple to a transmission line of a TX path.

In certain aspects, both the coupled port P3 and isolated port P4 may be coupled to power detectors, respectively. The power detectors may be configured to measure power (e.g., voltage) at the coupled port P3 and isolated port P4, respectively. In particular, for a TX path, antenna return loss may be measured to adjust the signal transmitted. Antenna return loss is calculated as the ratio of reflected power (e.g., from antenna 303) to forward power (e.g., from PA 316) at a given time. As discussed, reflected power may be measured at the isolated port P4, and forward power may be measured at the coupled port P3. Therefore, to measure antenna return loss with accuracy, both power at the isolated port P4 and coupled port P3 may need to be measured with high directivity. In addition, the reflected power and forward power may beneficially be measured at the same time, thereby increasing the accuracy of the calculation of antenna return loss as the measurement corresponds to the reflected power and forward power at the same time, instead of at separate times. In particular, using measurements at separate times may not lead to an accurate calculation of antenna return loss at a given time as the measurements may change at different times.

Without the design of the directional coupler according to aspects described herein, measurement of forward power and reflected power at the same time may not be feasible. In particular, the reflection of the power from each of the power detectors at the coupled port P3 and isolated port P4 would lead to inaccurate measurements without the complex impedances also being coupled to the coupled port P3 and isolated port P4 at the same time. Further, the values of the complex impedances are selected in such a manner to increase the accuracy of the measurements. For example, in certain aspects, the values of the complex impedances are selected to take in to account the loading impedances of the power detectors.

In addition, the directional coupler may be used with high frequency signals (e.g., >25 GHz, such as in mmWave systems), which may provide more accurate measurements of power at the coupled port P3 and isolated port P4 when measured at the same time as compared to other systems.

Figure 6:
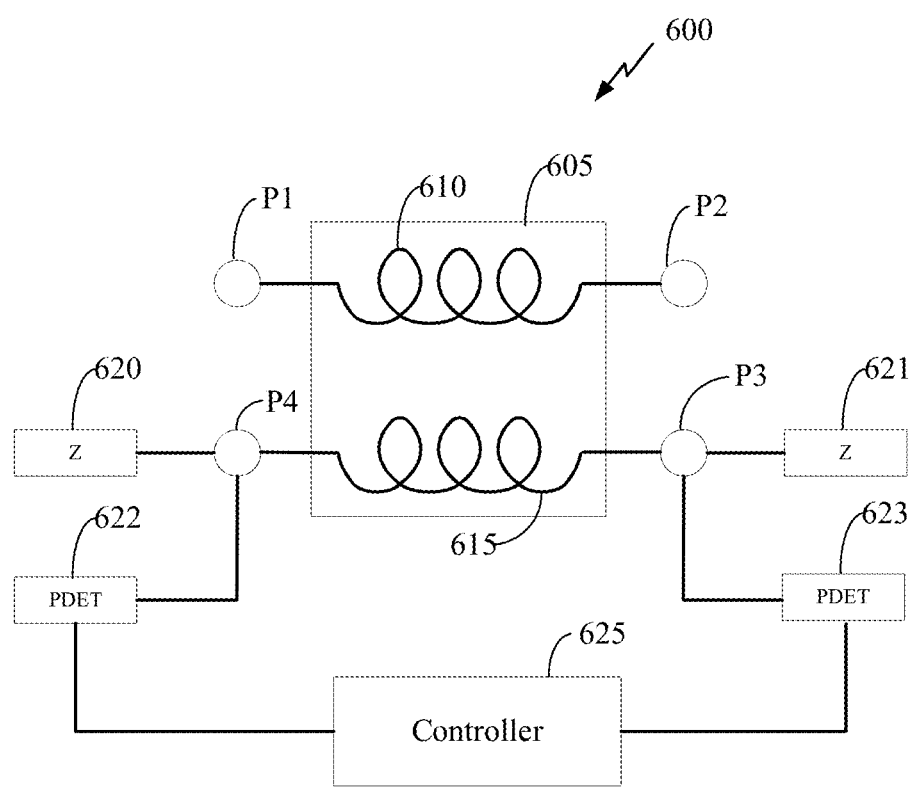
FIG. 6 illustrates an example directional coupler, in accordance with certain aspects of the present disclosure.

FIG. 6 illustrates an example directional coupler 600 according to certain aspects of the present disclosure. In certain aspects, directional coupler 600 may be a high directivity implementation of directional coupler 450 of FIG. 4. Directional coupler 600 includes a transformer 605 comprising a first inductor 610 and a second inductor 615. In certain aspects, at least a portion of the first inductor 610 and at least a portion of the second inductor 615 are physically located in parallel to one another. In certain aspects, at least a portion of the first inductor 610 and at least a portion of the second inductor 615 are close enough such that energy passing through first inductor 610 is wirelessly coupled to second inductor 615. The first inductor 610 and second inductor 615, in certain aspects, are not directly physically coupled together by a physical electrical conductor. Instead, power may be transferred through dielectrics and first inductor 610 and second inductor 615 may be wirelessly coupled to one another. In certain embodiments, the first inductor 610 and second inductor 615 comprise transmission lines in a heterogeneous material (e.g., on-chip).

Further, the directional coupler 600 includes input port P1 and transmitted port P2 each at (e.g., physically electrically coupled to) separate terminals of first inductor 610. The directional coupler 600 also includes coupled port P3 and isolated port P4 each at (e.g., physically electrically coupled to) separate terminals of second inductor 615. Though coupled port P3 is shown at the same end as transmitted port P2 and the isolated port P4 is shown at the same end as input port P1, it should be noted that in some implementations (e.g., depending on a mode of the directional coupler 600) the coupled port P3 is instead at the same end as input port P1 and the isolated port P4 is at the same end as transmitted port P2.

Isolated port P4 is coupled to a complex impedance component 620 that provides a complex impedance. Further, coupled port P3 is coupled to a complex impedance component 621 that also provides a complex impedance. Each of complex impedance components 620 and 621 may include one or more components that provide a complex impedance, such as one or more capacitors and/or inductors that provide an imaginary portion of the complex impedance. Each of complex impedance components 620 and 621 may further include one or more components, such as one or more resistors, that provide a real portion of the complex impedance. The complex impedance components 620 and 621 may comprise the same or different components. In certain aspects, complex impedance component 620 and/or 621 comprises one or more switches, such as to selectively couple or decouple components of the complex impedance component thereby changing the complex impedance value.

The various components of each of complex impedance components 620 and 621 may be coupled in series, parallel, or in any suitable configuration to provide a complex impedance. For example, the complex impedance component 621 may comprise an inductor in series with a resistor and the complex impedance component 620 may comprise a capacitor in parallel with a resistor. In certain aspects, each of complex impedance components 620 and 621 is further coupled to a reference voltage (e.g., ground). As discussed, the design of directional coupler 600 in certain aspects has a high directivity.

The isolated port P4 is further coupled to a power detector (PDET) 622, and the coupled port P3 is further coupled to a PDET 623. In certain aspects, each of PDETs 622 and 623 is further coupled to a reference voltage (e.g., ground). PDET 622 is configured to measure a power (e.g., voltage) at isolated port P4. For example, in certain aspects PDET 622 is configured to measure reflected power and PDET 623 is configured to measure forward power. PDET 622 and PDET 623 may be configured to measure power at the same time. For example, PDET 622 and PDET 623 may be coupled to a controller 625 (e.g., integrated circuit, RFIC, processor, circuit, etc.) configured to control each of PDET 622 and PDET 623 to measure power. Controller 625 may be configured to control PDET 622 and PDET 623 to measure power (e.g., at substantially the same time) at isolated port P4 and coupled port P3, respectively. Controller 625 may further be configured to receive the power measurements and calculate an accurate antenna return loss.

Figure 7:
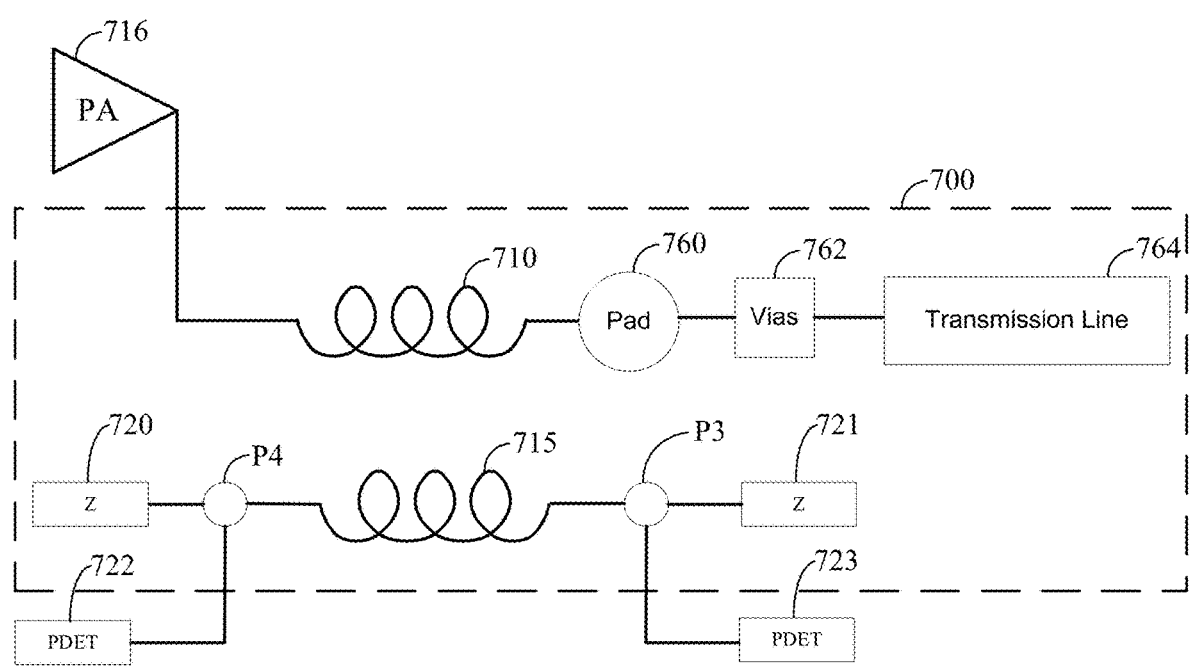
FIG. 7 illustrates an example directional coupler, in accordance with certain aspects of the present disclosure.

FIG. 7 illustrates an example on-chip directional coupler design, in accordance with certain aspects of the present disclosure. Directional coupler 700 may be an implementation of the directional coupler 600 of FIG. 6. In certain aspects, the components that make up directional coupler 700 include a first inductor 710 and a second inductor 715, similar to first inductor 610 and second inductor 615 of directional coupler 600 of FIG. 6. The directional coupler 700 further includes an input port on first inductor 710 coupled to the output of a PA 716, similar to the PA 416 of FIG. 4. In addition, the directional coupler 700 includes a pad 760 (e.g., similar to pad 560 of FIG. 5) coupled to a transmitted port on first inductor 710. The pad 760 is further coupled to vias 762 (similar to vias 562 of FIG. 5), which is further coupled to a transmission line 764 (e.g., of a package or PCB) of directional coupler 700. Vias 762 and transmission line 764 are further a part of directional coupler 700, as shown.

The directional coupler 700 also includes a first complex impedance component 720 (e.g., similar to complex impedance component 620 of FIG. 6) coupled to an isolated port P4 on second inductor 715. The directional coupler 700 further includes a second complex impedance component 721 (e.g., similar to complex impedance component 621 of FIG. 6) coupled to a coupled port P3 on second inductor 715. In certain aspects, a PDET 722 (e.g., similar to PDET 622 of FIG. 6) is further coupled to isolated port P4, and a PDET 723 (e.g., similar to PDET 623 of FIG. 6) is further coupled to coupled port P3.

In certain aspects, each of the components 710-721 of directional coupler 700 is formed on the same chip. In certain aspects, PDETs 722 and 723 are also formed on the same chip as components 710-721. In certain aspects, the chip including directional coupler 700 therefore needs to couple to a PCB with a transmission line to an antenna at only one point, the transmission port. As shown, pad 760, vias 762, and transmission line 764 may be formed on a package or PCB, and only the one pad 760 is needed to couple the chip including directional coupler 700 to the package or PCB. This provides savings in silicon area, such as compared to the design of PCB directional coupler 550 of FIG. 5. In certain aspects, the directional coupler 700 may be on the same package or substrate as the PA 716.

Figure 8:
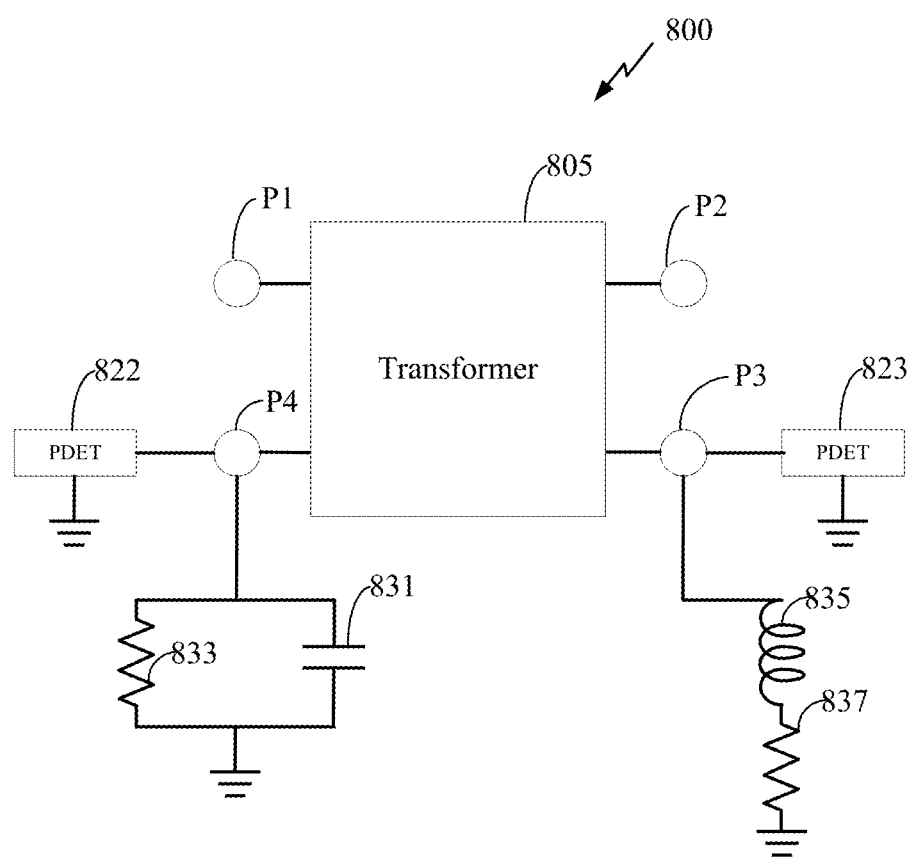
FIG. 8 illustrates an example directional coupler, in accordance with certain aspects of the present disclosure.

FIG. 8 illustrates an example directional coupler, in accordance with certain aspects of the present disclosure. Directional coupler 800 may be an implementation of the directional coupler 600 of FIG. 6. In certain aspects, the components that make up directional coupler 800 include a transformer 805, similar to transformer 605 of directional coupler 600 of FIG. 6. The directional coupler 800 further includes an input port P1 and a transmitted port P2.

The directional coupler 800 also includes a capacitor 831 in parallel with a resistor 833 (e.g., corresponding to complex impedance component 620 of FIG. 6) coupled to an isolated port P4 of transformer 805. The directional coupler 800 further includes an inductor 835 in series with a resistor 837 (e.g., corresponding to complex impedance component 621 of FIG. 6) coupled to a coupled port P3 of transformer 805. In certain aspects, a PDET 822 (e.g., similar to PDET 622 of FIG. 6) is further coupled to isolated port P4, and a PDET 823 (e.g., similar to PDET 623 of FIG. 6) is further coupled to coupled port P3.

Figure 9:
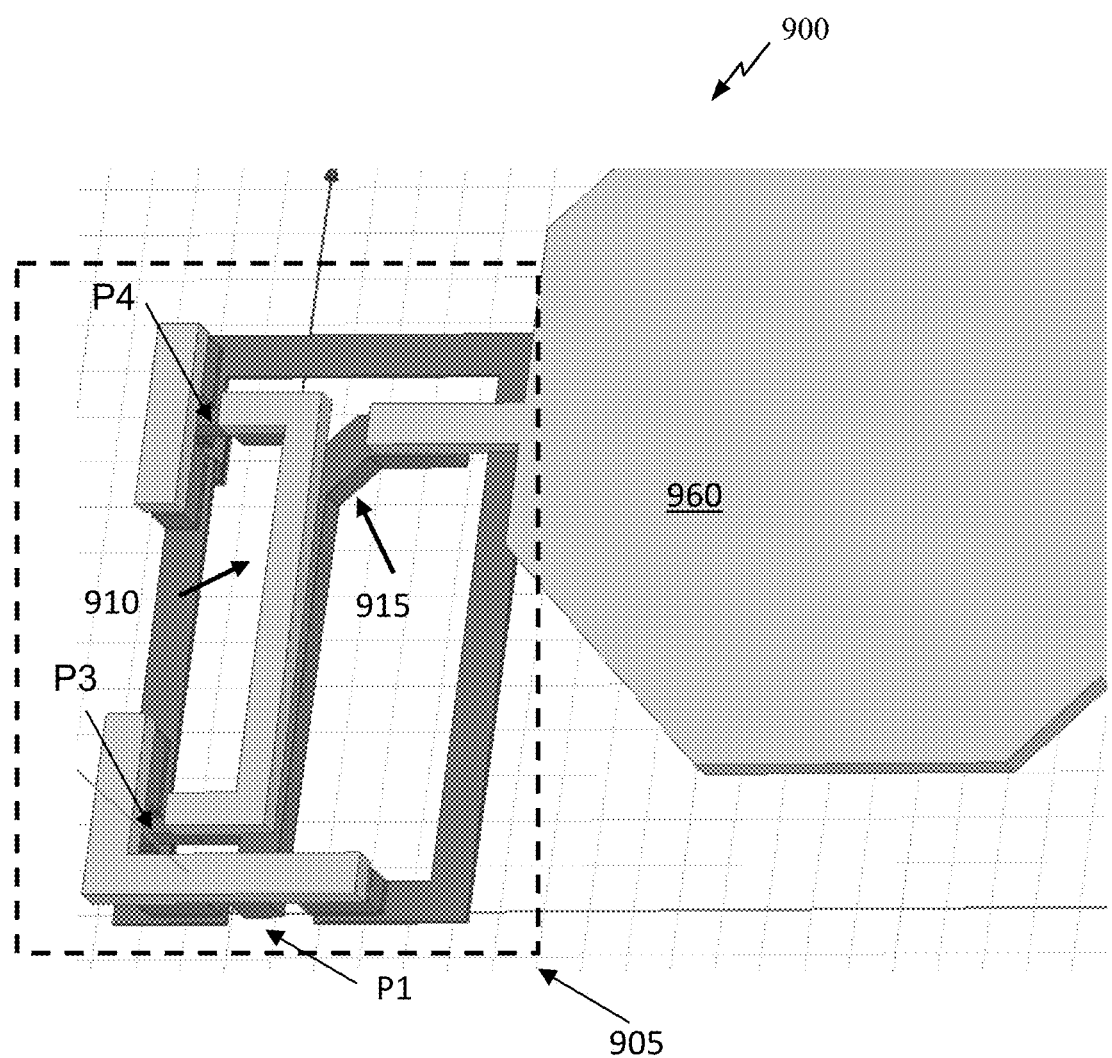
FIG. 9 illustrates a 3D view of an example directional coupler, in accordance with certain aspects of the present disclosure.

FIG. 9 illustrates a 3D view of an example directional coupler 900, in accordance with certain aspects of the present disclosure. Directional coupler 900 is an example physical implementation (e.g., on chip) of a directional coupler, such as any of the directional couplers discussed herein including directional couplers 600, 700, and 800 of FIGS. 6, 7, and 8, respectively.

Directional coupler 900 includes a first inductor 910 (e.g., similar to first inductor 610 of FIG. 6). Directional coupler 900 further includes a second inductor 915 (e.g., similar to second inductor 615 of FIG. 6). The first inductor 910 and second inductor 915 form a transformer 905 (e.g., similar to transformer 605 of FIG. 6). A pad 960 (e.g., similar to pad 760 of FIG. 7) is coupled to a transmitted port of transformer 905. The transformer 905 further includes an input port P1, a coupled port P3, and a transmitted port P4. In certain aspects, as shown, the first inductor 910 and second inductor 915 are in a stacked configuration.

Figure 10:
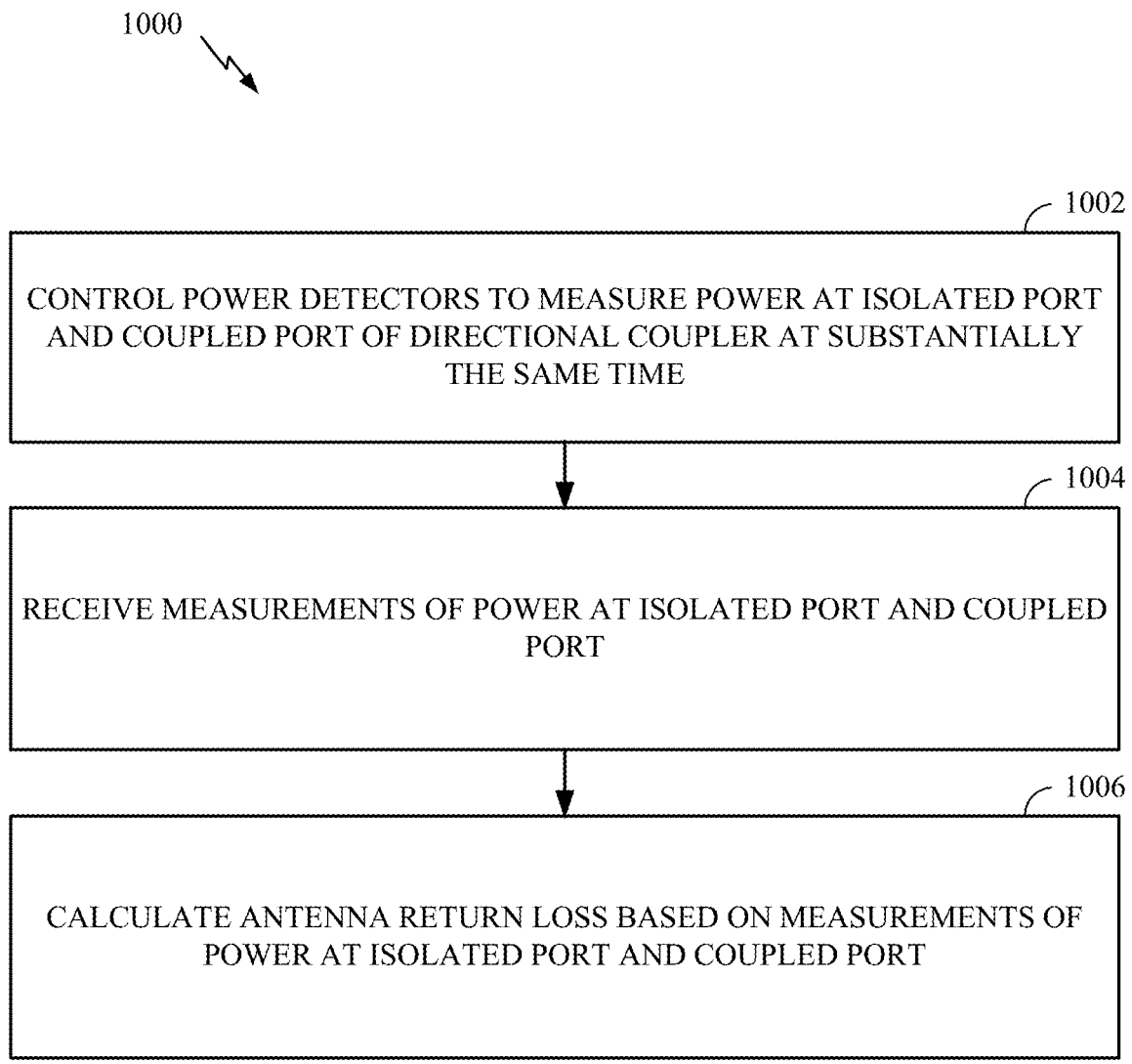
FIG. 10 illustrates example operations for measuring antenna return loss using a directional coupler, in accordance with aspects of the present disclosure.

FIG. 10 illustrates example operations 1000 for measuring antenna return loss using a directional coupler, in accordance with aspects of the present disclosure. For example, operations 1000 may be performed by a controller 625 using directional coupler 600.

Operations 1000 begin at 1002 where controller 625 controls PDET 622 and PDET 623 to measure power at the isolated port P4 and the coupled port P3, respectively, at substantially the same time. The isolated port P4 is coupled to complex impedance 620 and the coupled port P3 is coupled to the complex impedance 621 during the measuring by the PDETs 622 and 623.

At 1004, the controller 625 receives from PDET 622 a measurement indicative of the power at the isolated port P4, and from PDET 623 a measurement indicative of the power at the coupled port P3.

At 1006, the controller calculates an antenna return loss based on the measurement indicative of the power at the isolated port P4 and the measurement indicative of the power at the coupled port P3.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A wireless communication apparatus comprising:
   a power amplifier;
   an antenna;
   a directional coupler coupled between the power amplifier and the antenna, wherein the directional coupler comprises an input port, a transmitted port, a coupled port, and an isolated port;
   a first complex impedance component coupled to the isolated port;
   a second complex impedance component coupled to the coupled port, wherein one of the first complex impedance component and the second complex impedance component comprises an inductor coupled to a resistor in series, wherein the resistor is further coupled to ground, and wherein the other of the one of the first complex impedance component and the second complex impedance component comprises a capacitor coupled in parallel with a second resistor and further coupled to ground;
   a first power detector coupled to the isolated port and configured to measure a first power at the isolated port while both the first complex impedance component is coupled to the isolated port and the second complex impedance component is coupled to the coupled port at the same time; and
   a second power detector coupled to the coupled port and configured to measure a second power at the coupled port while both the first complex impedance component is coupled to the isolated port and the second complex impedance component is coupled to the coupled port at the same time.

2. The wireless communication apparatus of claim 1, further comprising a controller configured to cause the first power detector to measure the first power while both the first complex impedance component is coupled to the isolated port and the second complex impedance component is coupled to the coupled port at the same time.

3. The wireless communication apparatus of claim 1, further comprising a controller configured to cause the second power detector to measure the second power while both the first complex impedance component is coupled to the isolated port and the second complex impedance component is coupled to the coupled port at the same time.

4. The wireless communication apparatus of claim 1, further comprising a controller configured to cause the first power detector and the second power detector to measure the first power and the second power at substantially the same time.

5. The wireless communication apparatus of claim 4, wherein the controller is configured to calculate an antenna return loss based on the measured first power indicative of a power output by the amplifier and the measured second power indicative of a reflected power from the antenna.

6. The wireless communication apparatus of claim 1, wherein the first complex impedance component provides a first complex impedance including an imaginary portion of the first complex impedance and the second complex impedance component provides a second complex impedance including an imaginary portion of the second complex impedance.

7. The wireless communication apparatus of claim 1, wherein the directional coupler comprises a transformer.

8. The wireless communication apparatus of claim 1, wherein the directional coupler does not include a physical capacitor in-between either of the input port and the coupled port or the transmitted port and the isolated port.

9. The wireless communication apparatus of claim 1, wherein the directional coupler is formed inside a heterogeneous dielectric material.

10. The wireless communication apparatus of claim 1, wherein the directional coupler and power amplifier are formed on the same substrate.

11. The wireless communication apparatus of claim 1, wherein the first complex impedance component is coupled to the isolated port via a first switch, and wherein the second complex impedance component is coupled to the coupled port via a second switch.

12. The wireless communication apparatus of claim 1, wherein the first complex impedance component is directly coupled to the isolated port, and wherein the second complex impedance component is directly coupled to the coupled port.

13. A directional coupler comprising:
   a first inductor;
   a second inductor wirelessly coupled to the first inductor;
   an input port at a first terminal of the first inductor;
   a transmitted port at a second terminal of the first inductor;
   a coupled port at a first terminal of the second inductor;
   an isolated port at a second terminal of the second inductor;
   a first complex impedance component directly coupled to the isolated port;
   a second complex impedance component directly coupled to the coupled port, wherein one of the first complex impedance component and the second complex impedance component comprises an inductor coupled to a resistor in series, wherein the resistor is further coupled to ground, and wherein the other of the one of the first complex impedance component and the second complex impedance component comprises a capacitor coupled in parallel with a second resistor and further coupled to ground;

a first power detector coupled to the isolated port and configured to measure a first power at the isolated port while both the first complex impedance component is coupled to the isolated port and the second complex impedance component is coupled to the coupled port at the same time; and a second power detector coupled to the coupled port and configured to measure a second power at the coupled port while both the first complex impedance component is coupled to the isolated port and the second complex impedance component is coupled to the coupled port at the same time.

14. The directional coupler of claim 13, further comprising:
a controller configured to cause the first power detector to measure the first power while both the first complex impedance component is coupled to the isolated port and the second complex impedance component is coupled to the coupled port at the same time and cause the second power detector to measure the second power while both the first complex impedance component is coupled to the isolated port and the second complex impedance component is coupled to the coupled port at the same time.

15. The directional coupler of claim 14, wherein the controller is further configured to cause the first power detector and the second power detector to measure the first power and the second power at substantially the same time.

16. The directional coupler of claim 15, wherein the controller is configured to calculate an antenna return loss based on the measured first power and the measured second power.

17. The directional coupler of claim 13, wherein the first complex impedance component provides a first complex impedance including an imaginary portion of the first complex impedance and the second complex impedance component provides a second complex impedance including an imaginary portion of the second complex impedance.

18. The directional coupler of claim 13, wherein the first inductor and the second inductor form a transformer.

19. The directional coupler of claim 13, wherein the first inductor and the second inductor are formed inside a heterogeneous dielectric material.

20. The directional coupler of claim 13, wherein there is no physical capacitor between the input port and the coupled port, and wherein there is no physical capacitor between the transmitted and the isolated port.

21. The directional coupler of claim 13, wherein at least part of the first inductor is physically parallel to at least part of the second inductor, and wherein the first inductor is not directly physically coupled by a physical electrical conductor to the second inductor.

22. The directional coupler of claim 13, wherein the input port is coupled to a power amplifier, and wherein the transmitted port is coupled to an antenna.

23. The directional coupler of claim 22, wherein a signal at the coupled port is indicative of a power output of the power amplifier, and wherein a signal at the isolated port is indicative of a power input at the transmitted port.

24. A method of operating a directional coupler comprising an input port, a transmitted port, a coupled port, and an isolated port, wherein a first complex impedance component is coupled to the isolated port and a second complex impedance component is coupled to the coupled port, the method comprising:
measuring a first power at the isolated port and a second power at the coupled port at substantially the same time while both the first complex impedance component is coupled to the isolated port and the second complex impedance component is coupled to the coupled port at the same time; and calculating an antenna return loss based on the measured first power and the measured second power, wherein one of the first complex impedance component and the second complex impedance component comprises an inductor coupled to a resistor in series, wherein the resistor is further coupled to ground, and wherein the other of the one of the first complex impedance component and the second complex impedance component comprises a capacitor coupled in parallel with a second resistor and further coupled to ground.

25. The method of claim 24, wherein the first power is indicative of a power output of a power amplifier coupled to the input port, and wherein the second power is indicative of a reflected power of an antenna coupled to the transmitted port.

26. The method of claim 24, wherein the first complex impedance component is different than the second complex impedance component.

* * * * *